(12) United States Patent
Chern

(10) Patent No.: US 6,750,090 B2
(45) Date of Patent: Jun. 15, 2004

(54) SELF ALIGNED METHOD OF FORMING A SEMICONDUCTOR MEMORY ARRAY OF FLOATING GATE MEMORY CELLS WITH FLOATING GATES HAVING MULTIPLE SHARP EDGES, AND A MEMORY ARRAY MADE THEREBY

(75) Inventor: Geeng-Chuan Chern, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/351,138

(22) Filed: Jan. 24, 2003

(65) Prior Publication Data

US 2003/0141539 A1 Jul. 31, 2003

Related U.S. Application Data

(62) Division of application No. 09/931,956, filed on Aug. 16, 2001, now Pat. No. 6,563,167.
(60) Provisional application No. 60/260,129, filed on Jan. 5, 2001.

(51) Int. Cl.⁷ .......................................... H01L 21/8238
(52) U.S. Cl. ...................................... 438/201; 438/257
(58) Field of Search ............................... 438/201, 211, 438/218, 257, 263, 264; 257/314, 315, 316, 317, 319, 320, 321

(56) References Cited

U.S. PATENT DOCUMENTS

| | | |
|---|---|---|
| 4,757,360 A | 7/1988 | Faraone |
| 4,794,565 A | 12/1988 | Wu et al. |
| 4,882,707 A | 11/1989 | Mizutani |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |
| 5,041,886 A | 8/1991 | Lee |
| 5,101,250 A | 3/1992 | Arima et al. |
| 5,268,319 A | 12/1993 | Harari |
| 5,429,965 A | 7/1995 | Shimoji |
| 5,544,103 A | 8/1996 | Lambertson |
| 5,572,054 A | 11/1996 | Wang et al. |
| 5,597,751 A | 1/1997 | Wang |
| 5,780,341 A | 7/1998 | Ogura |
| 5,780,892 A | 7/1998 | Chen |
| 5,789,293 A | 8/1998 | Cho et al. |

(List continued on next page.)

FOREIGN PATENT DOCUMENTS

EP 0389721 10/1990

OTHER PUBLICATIONS

U.S. patent application Ser. No. 09/401,622, Johnson, filed Sep. 22, 1999.

*Primary Examiner*—Long Pham
*Assistant Examiner*—Hoai Pham
(74) *Attorney, Agent, or Firm*—Gray Cary Ware & Freidenrich LLP

(57) ABSTRACT

A self aligned method of forming a semiconductor memory array of floating gate memory cells in a semiconductor substrate having a plurality of spaced apart isolation regions and active regions on the substrate substantially parallel to one another in the column direction. Floating gates are formed in each of the active regions, each having a pair of upwardly extending sharp edges that extend lengthwise parallel to, and are adjacent to, one of the isolation regions. Control gates are each formed with a substantially vertical face portion by covering a portion of a conductive layer with a protective layer, and performing an anisotropic etch to remove the exposed portion of the conductive layer. An insulation sidewall spacer is formed against the vertical face portion. The control gates have protruding portions that extend over the floating gates, including portions of the pair of upwardly extending sharp edges.

20 Claims, 11 Drawing Sheets

U.S. PATENT DOCUMENTS

| | | |
|---|---|---|
| 5,796,139 A | 8/1998 | Fukase |
| 5,808,328 A | 9/1998 | Nishizawa |
| 5,811,853 A | 9/1998 | Wang |
| 5,814,853 A | 9/1998 | Chen |
| 6,091,104 A | 7/2000 | Chen |
| 6,103,573 A | 8/2000 | Harari et al. |
| 6,140,182 A | 10/2000 | Chen |
| 6,222,227 B1 | 4/2001 | Chen |
| 6,262,452 B1 | 7/2001 | Ono et al. |
| 6,459,121 B1 * | 10/2002 | Sakamoto et al. .......... 257/315 |
| 6,562,681 B2 * | 5/2003 | Tuan et al. .................. 438/257 |
| 6,589,840 B2 * | 7/2003 | Tseng ........................ 438/257 |

\* cited by examiner

SELF ALIGNED METHOD OF FORMING A SEMICONDUCTOR MEMORY ARRAY OF FLOATING GATE MEMORY CELLS WITH FLOATING GATES HAVING MULTIPLE SHARP EDGES, AND A MEMORY ARRAY MADE THEREBY

PRIORITY

This application is a divisional application and claims the benefit of U.S. patent application Ser. No. 09/931,956 filed on Aug. 16, 2001, now U.S. Pat. No. 6,563,167, the disclosure of which is incorporated herein by reference, which claims the benefit of U.S. Provisional Application No. 60/260,129, filed Jan. 5, 2001, and entitled Self-Aligned Nonvolatile Memory Cells.

TECHNICAL FIELD

The present invention relates to a self-aligned method of forming a semiconductor memory array of floating gate memory cells of the split gate type. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type, or a combination thereof.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

In the split-gate architecture, the memory cells can be formed in mirrored pairs arranged end to end along columns, with the columns separated by columns of isolation areas. FIG. 1A illustrates a partially formed pair of memory cells, with floating gates 1 disposed over a substrate 2. A source region 3 is formed in the substrate 2, and is electrically connected to a source line 4. Insulating materials 5 insulate floating gate 1, substrate 2, source regions 3 and source line 4 from each other. Control gates 6 are formed adjacent and over, but insulated from, the floating gates 1. Control gates 6 extend over drain regions 7 formed in the substrate. FIG. 1B is an orthogonal view that illustrates the isolation regions 8 formed of insulation material that separates the columns of memory cells. A sharp edge 9 is formed on the floating gate to enhance Fowler-Nordheim tunneling between the floating gate 1 and control gate 6.

One problem with this configuration is that sharp edge 9 is typically formed using an anisotropic etch, which can result in the flattening of edge 9 if the block or spacer edge used to screen the etch process is not perfectly vertical. Additionally, as the design rules shrink, better Fowler-Nordheim tunneling between the floating gate and control gate for many application will be needed, despite the use of a sharp edge on the floating gate.

There is a need for a memory cell fabrication process that ensures the sharpness of the floating gate sharp edge, and enhances the Fowler-Nordheim tunneling between the floating and control gates.

SUMMARY OF THE INVENTION

The, present invention addresses the aforementioned needs by providing a self-aligned method of forming a semiconductor memory array of floating gate memory cells in a semiconductor substrate, where sharp edges on the floating gates can be reliably formed. The floating gate memory cells, and particularly the sharp edges on the floating gates, are easier to manufacture. The present invention lowers the coupling ratio between the control gate and the floating gate for better erase of the memory cell. Further, enhanced erase speeds are available given the limited word-line coverage of the floating gate sharp edges.

The present invention is a self-aligned method of forming a semiconductor memory array of floating gate memory cells in a semiconductor substrate, where each memory cell has a floating gate, a first region, a second region with a channel region therebetween, and a control gate. The method comprises the steps of:

a) forming a plurality of spaced apart isolation regions on the substrate which are substantially parallel to one another and extend in a first direction, with an active region between each pair of adjacent isolation regions, each of the active regions comprising a first layer of insulation material on the semiconductor substrate and a first layer of conductive material on the first layer of insulation material;

b) etching a top portion of the first layer of conductive material to form a pair of raised opposing sharp edges in the first layer of conductive material in each of the active regions that have a length extending in the first direction;

c) etching portions of the first layer of conductive material to form a plurality of discrete floating gates in each of the active regions, wherein each floating gate includes a portion of the raised opposing pair of sharp edges;

d) forming a plurality of spaced apart blocks of electrically conductive material in each of the active regions, wherein each of the blocks partially overlaps with and is isolated from one of the floating gates;

e) forming a plurality of first regions in the substrate, wherein in each of the active regions, each of the floating gates partially overlaps with and is isolated from one of the first regions; and f) forming a plurality of second regions in the substrate, wherein in each of the active regions each of the second regions is spaced apart from the first regions.

In another aspect of the present invention, an electrically programmable and erasable memory device includes a substrate of semiconductor material of a first conductivity type, first and second spaced-apart regions in the substrate of a second conductivity type, with a channel region therebetween, a first insulation layer disposed over said substrate, an electrically conductive floating gate disposed over said first insulation layer and extending over a portion of the channel region and over a portion of the first region, wherein the floating gate includes a pair of opposing raised sharp edges, a second insulation layer disposed over and adjacent the floating gate and having a thickness permitting Fowler-Nordheim tunneling of charges therethrough, and an electrically conductive control gate having a first portion disposed adjacent to and insulated from the floating gate and a second portion extending over a portion of the second insulation layer and over a portion of the floating gate including a portion of both of the raised sharp edges.

In yet another aspect of the present invention, an array of electrically programmable and erasable memory devices includes a substrate of semiconductor material of a first conductivity type, and spaced apart isolation regions formed on the substrate which are substantially parallel to one another and extend in a first direction, with an active region between each pair of adjacent isolation regions. Each of the active regions includes a plurality of memory cells extending in the first direction. Each of the memory cells includes first and second spaced-apart regions formed in the substrate having a second conductivity type, with a channel region formed in the substrate therebetween, a first insulation layer disposed over said substrate including over said channel region, an electrically conductive floating gate disposed over the first insulation layer and extending over a portion of the channel region and over a portion of the first region, wherein the floating gate includes a pair of opposing raised sharp edges, a second insulation layer disposed over and adjacent the floating gate and having a thickness permitting Fowler-Nordheim tunneling of charges therethrough, and an electrically conductive control gate having a first portion disposed adjacent to and insulated from the floating gate and a second portion extending over a portion of the second insulation layer and over a portion of the floating gate including a portion of the pair of raised sharp edges.

Other objects and features of the present invention will become apparent by a review of the specification, claims and appended figures.

DETAILED DESCRIPTION OF THE PREFERRED EMBODIMENTS

Figure 2A:
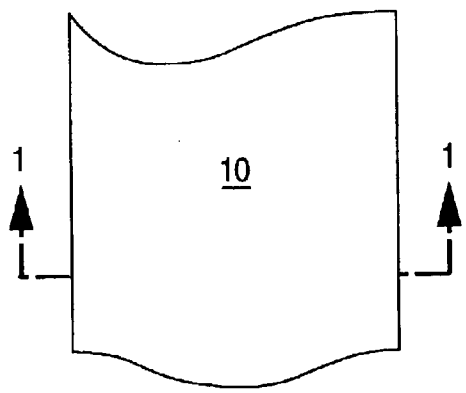
FIG. 2A is a top view of a semiconductor substrate used in the first step of the method of present invention to form isolation regions.
Figure 2B:
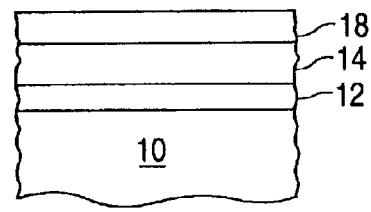
FIG. 2B is a cross sectional view of the structure of FIG. 2A taken along the line 1—1.

Referring to FIG. 2A there is shown a top plan view of a semiconductor A, substrate 10, which is preferably of P type and is well known in the art. A first layer of insulation material 12, such as silicon dioxide (oxide), is deposited thereon as shown in FIG. 2B. The first insulation layer 12 is formed on the substrate 10 by well known techniques such as oxidation or deposition (e.g. chemical vapor deposition or CVD), forming a layer of silicon dioxide (hereinafter "oxide"). A first layer of polysilicon 14 (FG poly) is deposited on top of the first layer of insulation material 12. The deposition and formation of the first polysilicon (hereinafter "poly") layer 14 on the first insulation layer 12 can be made by a well known process such as Low Pressure CVD or LPCVD. A silicon nitride layer 18 (hereinafter "nitride") is deposited over the polysilicon layer 14, preferably by CVD. This nitride layer 18 is used to define the active regions during isolation formation. Of course, all of the forgoing described parameters and the parameters described hereinafter, depend upon the design rules and the process technology generation. It will be understood by those skilled in the art that the present invention is not limited to any specific process technology generation, nor to any specific value in any of the process parameters described hereinafter.

Figure 2C:
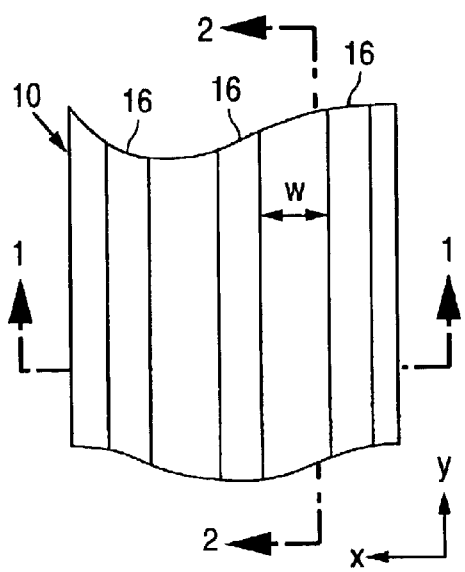
FIG. 2C is a top view of the next step in the processing of the structure of FIG. 2B, in which isolation regions are formed.
Figure 2D:
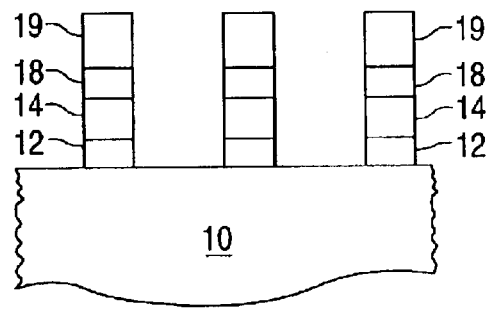
FIG. 2D is a cross sectional view of the structure in FIG. 2C taken along the line 1—1 showing the isolation stripes formed in the structure.

Once the first insulation layer 12, the first polysilicon layer 14, and the silicon nitride 18 have been formed, suitable photo-resistant material 19 is applied on the silicon nitride layer 18 and a masking step is performed to selectively remove the photo-resistant material from certain regions (stripes 16). Where the photo-resist material 19 is removed, the silicon nitride 18, the polysilicon 14 and the underlying insulation material 12 are etched away in stripes 16 formed in the Y direction or the column direction, as shown in FIG. 2C, using standard etching techniques (i.e. anisotropic etch process). The distance W between adjacent stripes 16 can be as small as the smallest lithographic feature of the process used. Where the photo resist 19 is not removed, the silicon nitride 18, the first polysilicon region 14 and the underlying insulation region 12 are maintained. The resulting structure is illustrated in FIG. 2D. As will be described, there are two embodiments in the formation of the isolation regions: LOCOS and STI. In the STI embodiment, the etching continues into the substrate 10 to a predetermined depth.

The structure is further processed to remove the remaining photo resist 19. It should be noted that the above described etching of polysilicon 14, insulation material 12 and substrate 10 can be performed before or after photo resist 19 is removed. Then, an isolation material 20a or 20b, such as silicon dioxide, is formed in the regions or "grooves"

16. The nitride layer 18 is then selectively removed to form the structure shown in FIG. 2E. The isolation can be formed via the well known LOCOS process resulting in the local field oxide 20a (e.g. by oxidizing the exposed substrate), or it can be formed via a shallow trench isolation process (STI) resulting in silicon-dioxide being formed in the region 20b (e.g. by depositing an oxide layer, followed by a Chemical-Mechanical-Polishing or CMP etch). It should be noted that during the LOCOS formation, a spacer may be necessary to protect the side walls of poly layer 14 during the formation of the local field oxide.

Figure 2E:
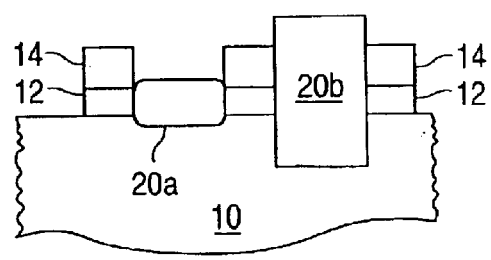
FIG. 2E is a cross sectional view of the structure in FIG. 2C taken along the line 1—1 showing the two types of isolation regions that can be formed in the semiconductor substrate: LOCOS or shallow trench.

The remaining first polysilicon layer 14 and the underlying first insulation material 12 form the active regions. Thus, at this point, the substrate 10 has alternating stripes of active regions and isolation regions with the isolation regions being formed of either LOCOS insulation material 20a or shallow trench insulation material 20b. Although FIG. 2E shows the formation of both a LOCOS region 20a and a shallow trench region 20b, only one of the LOCOS process (20a) or the shallow trench process (20b) will be used. In the preferred embodiment, the shallow trench 20b will be formed. Shallow trench 20b is preferable because it can be more precisely formed at smaller design rules.

The structure in FIG. 2E represents a self aligned structure, which is more compact than a structure formed by a non self-aligned method. A non self-aligned method of forming the structure shown in FIG. 2E, which is well known and is conventional, is as follows. Regions of isolation 20 are first formed in the substrate 10. This can be done by depositing a layer of silicon nitride on the substrate 10, depositing photo-resist, patterning the silicon nitride using a first masking step to expose selective portions of the substrate 10, and then oxidizing the exposed substrate 10 using either the LOCOS process or the STI process where silicon trench formation and trench fill are involved. Thereafter, the silicon nitride is removed, and a first layer of silicon dioxide 12 (to form the gate oxide) is deposited over the substrate 10. A first layer of polysilicon 14 is deposited over the gate oxide 12. The first layer of polysilicon 14 is then patterned using a second masking step and selective portions removed. Thus, the polysilicon 14 is not self aligned with the regions of isolation 20, and a second masking step is required. Further, the additional masking step requires that the dimensions of the polysilicon 14 have an alignment tolerance with respect to the regions of isolation 20. It should be noted that the non self-aligned method does not utilize nitride layer 18.

Figure 1A:
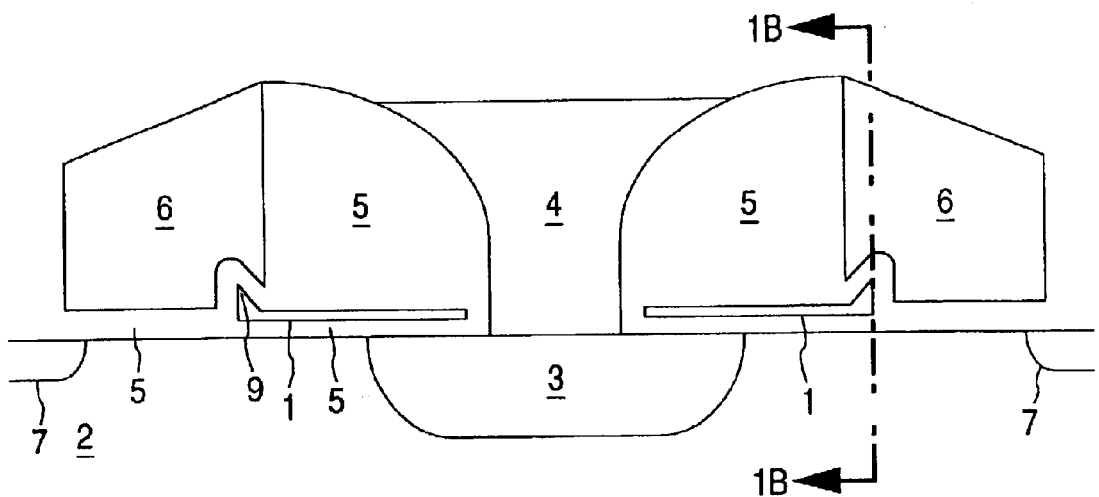
FIGS. 1A–1B are cross-sectional views of partially formed memory cell columns having floating gates each with a sharp edge.
Figure 1B:
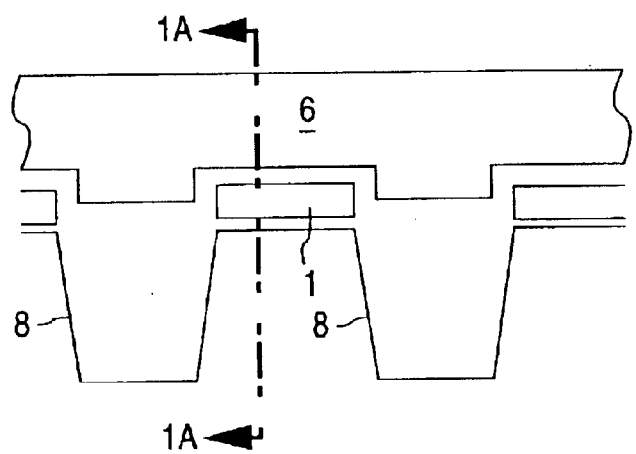
Figure 3A:
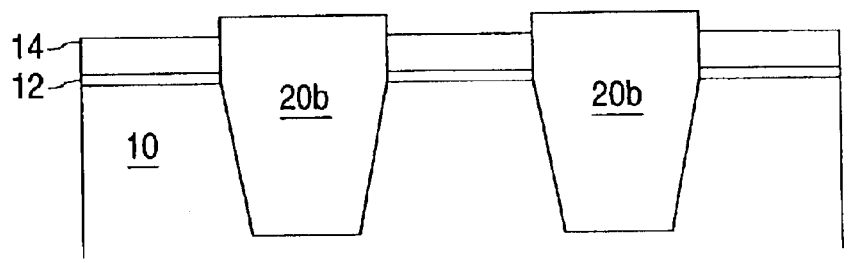
FIGS. 3A–3C are cross sectional views taken along the line 1—1 of FIG. 2C showing in sequence the next step(s) in the processing of the structure shown in FIG. 2C, in the formation of a non volatile memory array of floating memory cells of the split gate type.
Figure 3B:
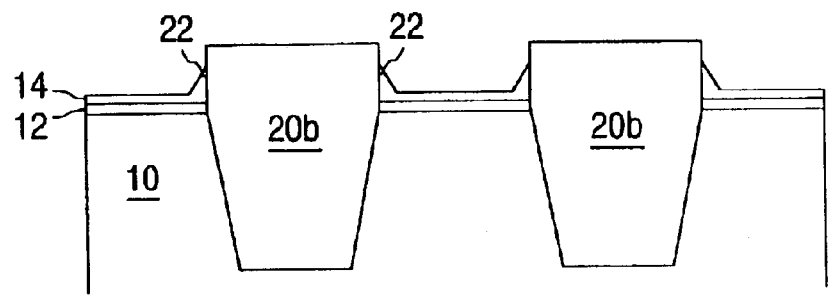

With the structure shown in FIG. 2E made using either the self aligned method or the non self-aligned method, the structure is further processed as follows. Referring to FIG. 3A, which shows the structure formed by the STI isolation process, an anisotropic or sloped dry poly etch process is then performed to remove a top portion of poly layer 14, as shown in FIG. 3B. The etch process leaves raised sharp edges 22 formed along opposing edges of poly layer 14. For each column of layer 14, these sharp edges 22 run along the length of the sides of poly layer 14 that abut isolation regions 20b.

Figure 3C:
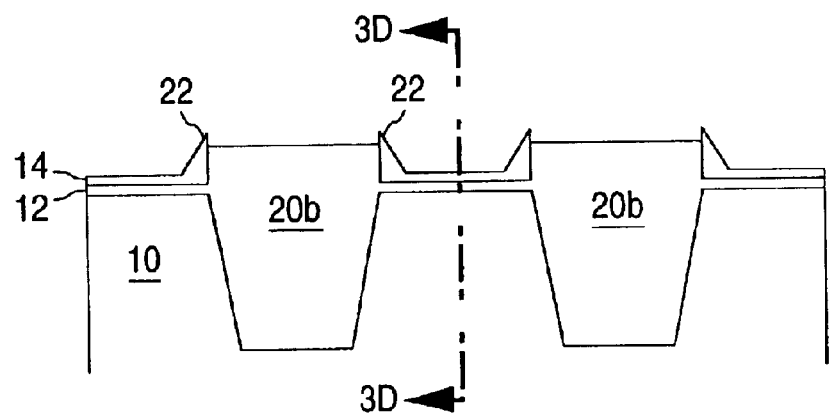

An oxide etch back process is then performed to remove the top portions of oxide material 20b, such that the sharp edges 22 of poly layer 14 extend above the top surface of isolation oxide material 20b, as shown in FIG. 3C.

Figure 3D:
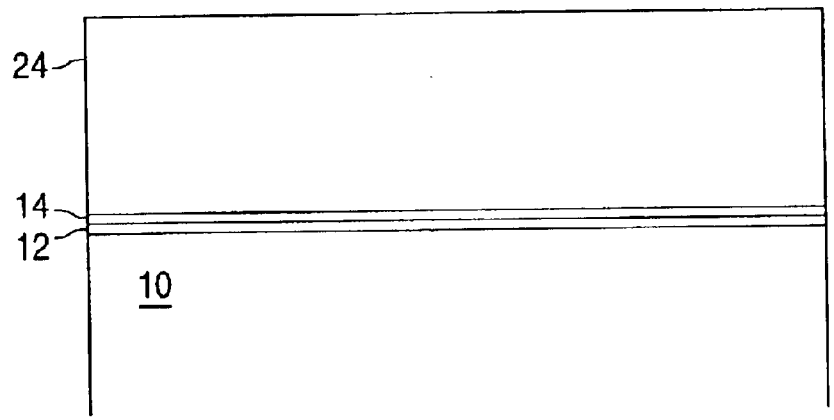
FIGS. 3D–3M are cross sectional views taken along the line 3D of FIG. 3C showing in sequence the next step(s) in the processing of the structure shown in FIG. 3C, in the formation of a non volatile memory array of floating memory cells of the split gate type.
Figure 3E:
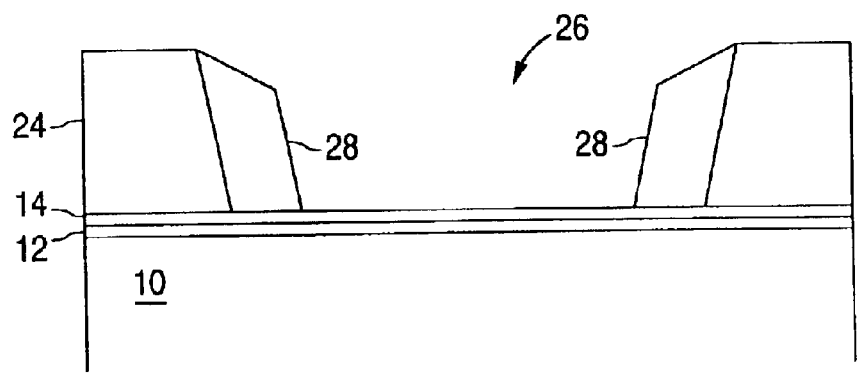

Referring to FIG. 3D, which shows the structure from a view orthogonal to that of FIG. 3C, the next steps in the process of the present invention are illustrated. An insulation layer 24, such as nitride, is formed over the structure. An optional oxide layer could be formed over the structure before the formation of layer 24. A masking operation is performed with photo-resist applied on top of the nitride layer 24. A masking step is applied in which stripes are defined in the X or the row direction. The distance between adjacent stripes can be a size determined by the needs of the device to be fabricated. The photo resist is removed in defined stripe regions, i.e. stripes in the row direction, after which nitride layer 24 underlying the removed photo resist is etched away in the stripes to expose the underlying poly layer 14. For each pair of mirror memory cells to be formed, this etch process results in the formation of a single first trench 26 that extends down to polysilicon layer 14. The remaining photo-resist is then removed. Optional insulation side wall spacers 28 are then formed along the side wall surfaces of trenches 26. The formation of side wall spacers is well known in the art, by depositing a material over the contour of a structure, followed by an anisotropic etch process (e.g. RIE), whereby the material is removed from horizontal surfaces of the structure, while the material remains largely intact on vertically oriented surfaces of the structure. Spacers 28 can be formed of any dielectric material. In the preferred embodiment, insulation spacers 28 are formed of nitride. The resulting structure is shown in FIG. 3E.

Figure 3F:
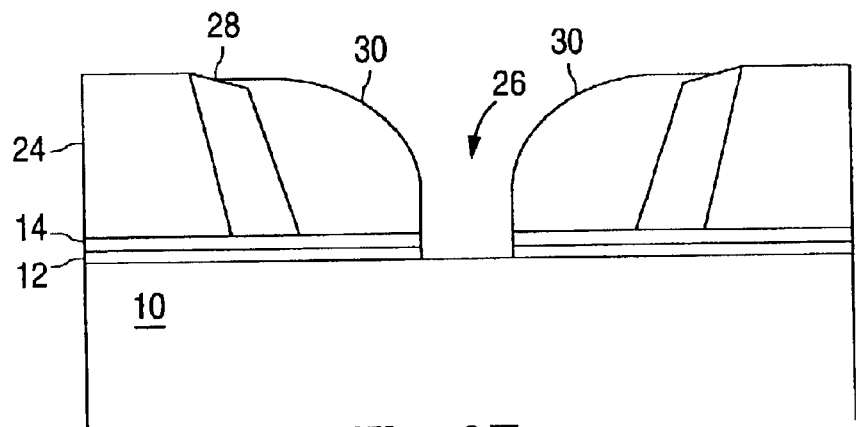

Insulation (oxide) side wall spacers 30 are then formed inside trenches 26 by depositing a thick layer of oxide, followed by an anisotropic oxide etch, which removes the deposited oxide except for spacers 30. An anisotropic poly etch process is performed between the opposing insulation spacers 30 to remove the exposed poly layer 14 at the bottom of trenches 26 until the oxide layer 12 is observed, which acts as an etch stop. An oxide etch is then performed to remove the thin oxide layer 12 between spacers 30 at the bottom of trenches 26 to expose substrate 10. The use of spacers 30 allows for the formation of trenches 26 having a width at the poly layer 14 that is less than the width of the masking step used to initially define the tops of trenches 26. The resulting structure is illustrated in FIG. 3F.

Figure 3G:
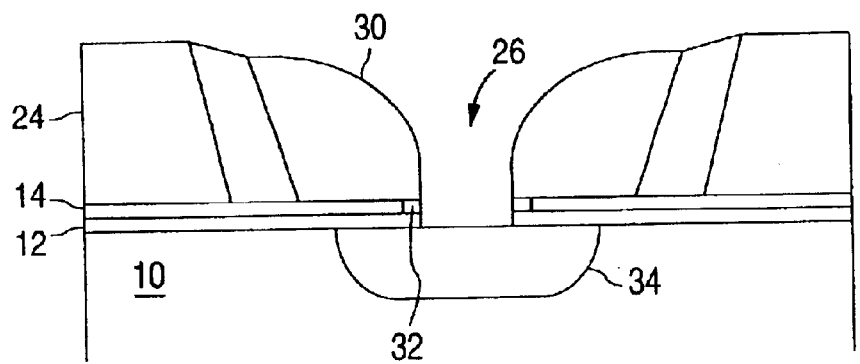

The sides of polysilicon layer 14 and the substrate surfaces that are exposed inside trenches 24 are oxidized in an oxidation step to form FG oxide side walls 32 on the sides of poly layer 14 and to reform oxide layer 12 over the substrate. Alternately, an insulation layer can be deposited followed by an anisotropic etch back process. Suitable ion implantation is then made across the entire surface of the structure. Where the ions have sufficient energy to penetrate the oxide layer 12 in trench 26, they then form a first region (i.e. a terminal) 34 in the substrate 10. In all other regions, the ions are absorbed by the existing structure, where they have no effect. A controlled oxide etch step is then performed to remove the center portion of oxide layer 12 from each of the trenches 24 to re-expose the substrate 10. The oxide etch process also removes a small portion of oxide from the top of spacers 30. It should be noted that the ion implantation can alternately be performed after layer 12 is removed. The resulting structure is shown in FIG. 3G.

Figure 3H:
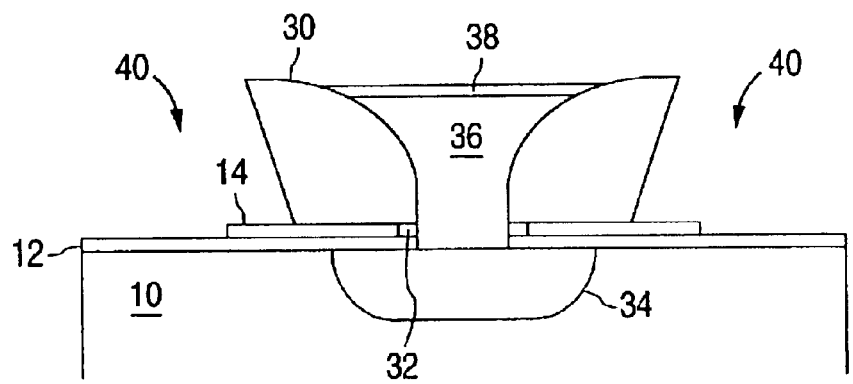

A poly deposition step is then performed, followed by a poly planarization (preferably by chemical-mechanical polishing (CMP)), to fill trenches 26 with poly blocks 36. A poly etch-back step follows to remove excess polysilicon outside of trenches 24. The polysilicon is properly doped either through an in-situ method or by conventional implantation. An oxide layer 38 is then formed over each of the poly blocks 36 in trenches 24 by thermal oxidation, which grows oxide layer 38 only on poly blocks 36. An anisotropic nitride etch is then performed to remove nitride layer 24, which also removes nitride spacers 28. An anisotropic poly etch follows to remove the portions of poly layer 14 not covered by oxide spacers 30. These nitride and poly etch steps effectively create second trenches 40 adjacent oxide spacers 30 on either side of the mirror set of memory cells. The resulting structure is shown in FIG. 3H.

Figure 3I:
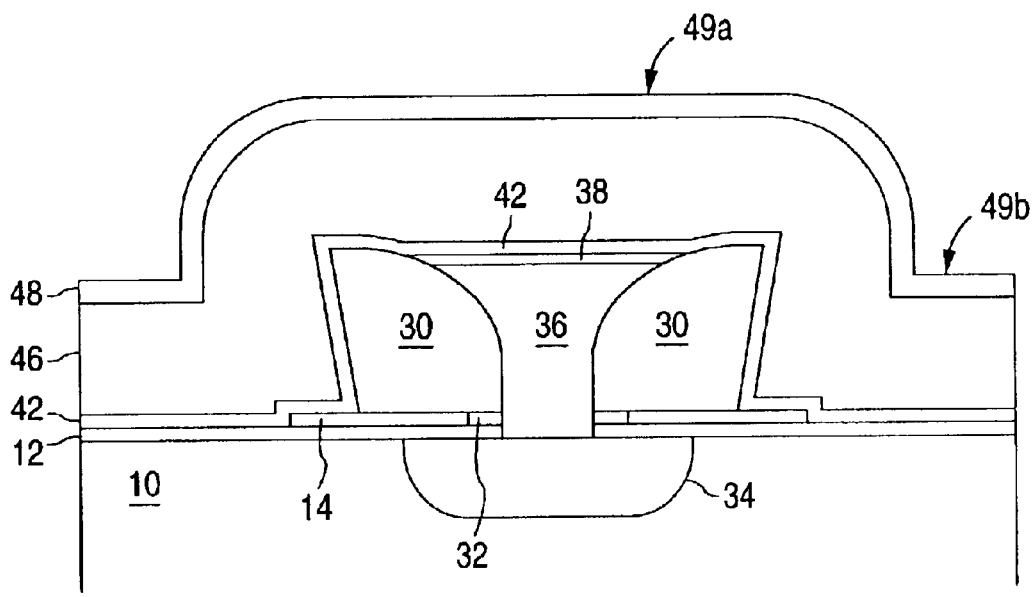

The next step is an oxide formation process, which forms an oxide layer 42 over the structure. Oxide layer 42 forms an insulation layer that is disposed adjacent to and over the exposed portions of polysilicon layer 14, including upwardly projecting sharp edges 22 at each side edge of polysilicon layer 14. The sharp edges 22 and the thickness of the insulation layer 42 permit Fowler-Nordheim tunneling of charges therethrough. A thick poly layer 46 is formed over the structure (filling trenches 40), which is followed by the formation of a nitride layer 48 over the poly layer 46, as illustrated in FIG. 3I. Preferably, nitride layer 48 is 10–300 nm thick. For each memory cell pair, the resulting structure has a raised central portion 49a and lower side portions 49b.

Figure 3J:
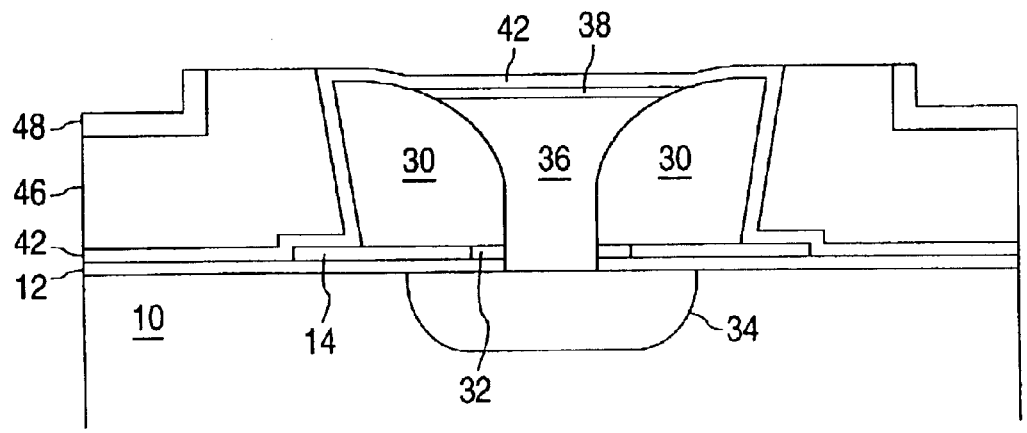

A planarization process follows, such as CMP, which removes the nitride layer 48 on the raised central portions 49a. The process is continued to remove the raised central portions of poly layer 46 and nitride layer 48 thereon, using oxide layer 42 as an etch stop, as shown in FIG. 3J. It is preferred that the slurry chosen for CMP should not etch nitride, but rather etch polysilicon only. Most of the mechanical polishing stress is applied to the poly layer 46, and it is undesirable to have the slurry etch away the relatively thin nitride layer 48. Preferably, the nitride layer 48 is removed mainly by mechanical polishing, so that once this CMP process is complete, portions of nitride layer 48 on the lower side portions 49b of poly layer 46 remain intact (to later serve as an oxidation protection layer).

Figure 3K:
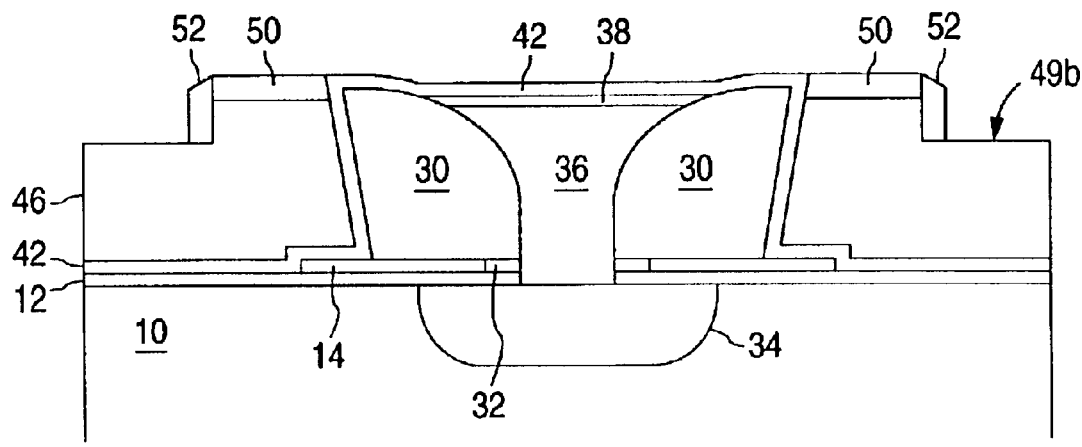

Poly layer 46 is partially covered and protected by nitride layer 48, with other portions that are left exposed by the CMP process. A layer of oxide 50 is formed on those exposed portions of poly layer 46, preferably by a thermal oxidation step. The oxide layer 50 is preferably 8–80 nm thick. An anisotropic nitride etch process follows, which removes nitride layer 48 from the horizontal surfaces of the structure, leaving nitride side wall spacers 52 over poly layer 46, and leaving lower portions 49b of poly layer exposed, as shown in FIG. 3K.

Figure 3L:
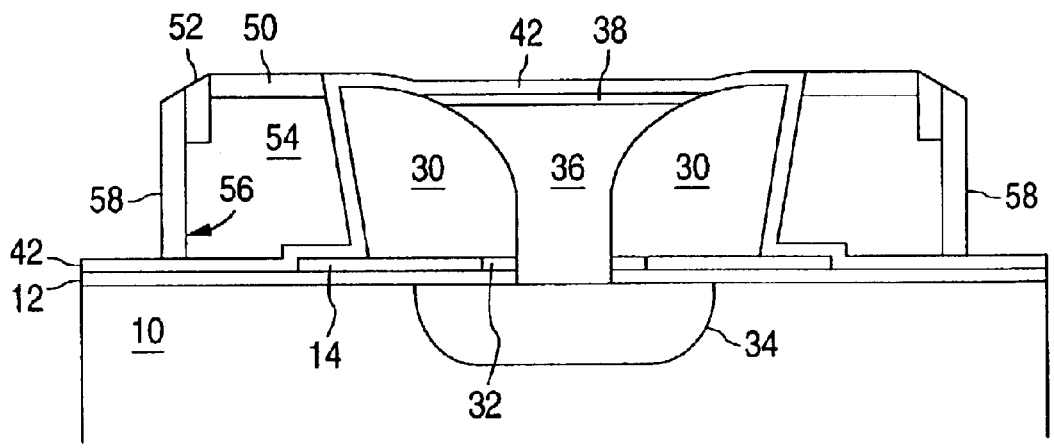

An anisotropic poly etch step is performed to remove the exposed portions of poly layer 46. The portions of poly layer 46 protected from the anisotropic etch process by oxide layer 50 and nitride spacers 52 form blocks 54 of polysilicon. Poly blocks 54 eventually form the control gates, and have vertical side walls 56 resulting from the anisotropic etch and protective oxide layers 50 and nitride spacers 52. The vertical sidewalls are ideal for spacer formation as follows. Nitride side wall spacers 58 are formed adjacent vertical side walls 56 of poly blocks 54 by depositing nitride over the structure followed by an anisotropic nitride etch (such as RIE dry etch) to remove all the added nitride except for side wall spacers 58, as shown in FIG. 3L. Side wall spacers 58 not only insulate poly blocks 54, but also facilitate the formation of self aligned salicide and contacts for the second regions as described next.

Figure 3M:
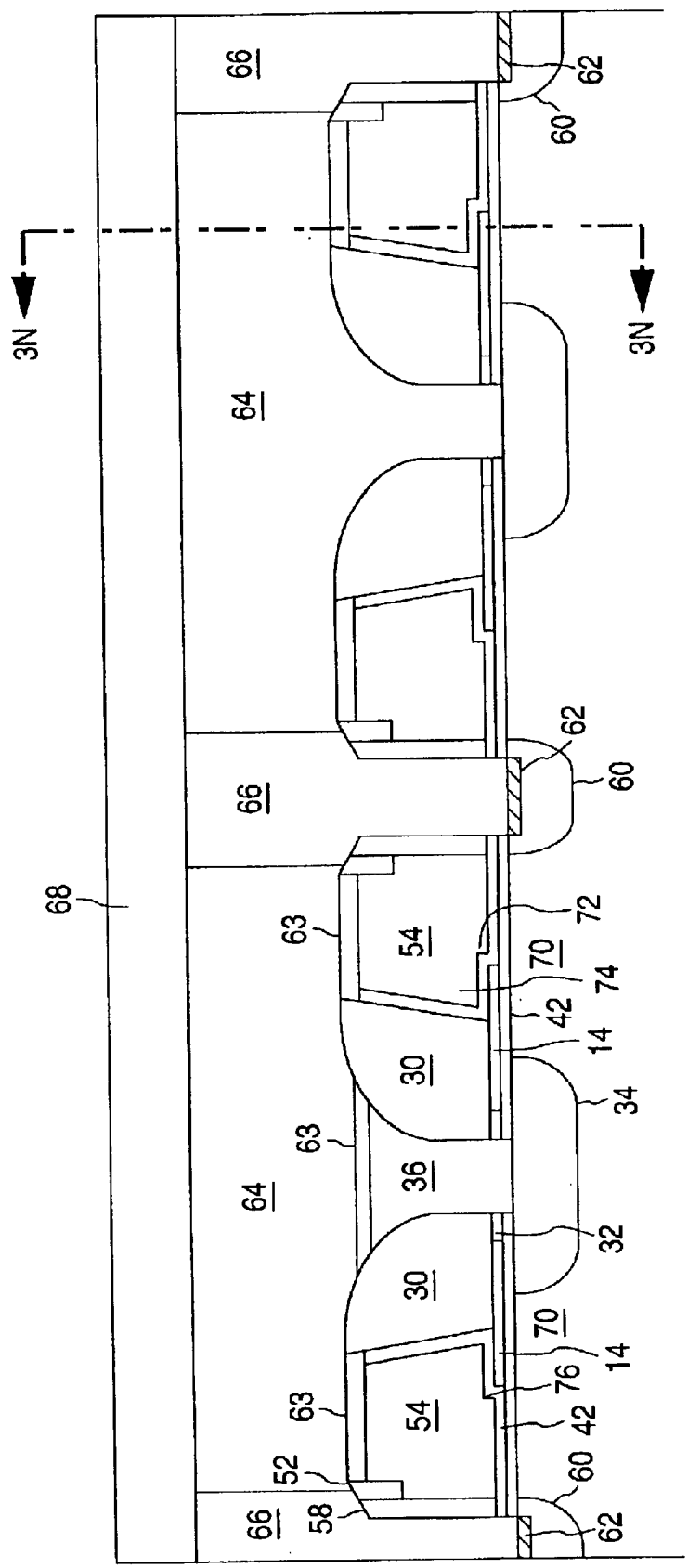

Ion implantation (e.g. N+) is used to form second regions (i.e. terminals) 60 in the substrate in the same manner as the first regions 34 were formed, as shown in FIG. 3M. A thin oxide etch is performed to remove the exposed portions of oxide layers 12 and 42 over substrate 10, and oxide layers 38, 42 and 50 over the structure. A metal deposition step is then performed, to deposit a metal such as tungsten, cobalt, titanium, nickel, platinum, or molybdenum over the structure. The structure is then annealed, permitting the metal to react with the exposed top portions of the substrate 10 and poly blocks 36/54 to form a conductive layer of metalized silicon 62 (silicide) on the substrate next to side wall spacers 58, and a conductive layer of metalized silicon 63 over the poly blocks 36 and 54. Metalized silicon regions 62 and 63 can be called self aligned silicide (i.e. salicide), because they are self aligned to the second regions 60 by spacers 58, and to the poly blocks 36 and 54 by spacers 30 and 52. Metalized silicon regions 63 facilitate conduction along the connected rows of poly blocks 36 and 54. The unreacted metal deposited on the remaining structure is removed by a metal etch process.

Passivation, such as BPSG 64, is used to cover the entire structure. A masking step is performed to define etching areas over the salicide regions 62. The BPSG 64 is selectively etched in the masked regions to create contact openings that are ideally centered over and wider than the salicide regions 62 formed between adjacent sets of paired memory cells. Nitride spacers 52 and 58 serve to protect poly blocks 54 from this etch process. The contact openings are then filled with a conductor metal 66 by metal deposition and planarizing etch-back, whereby the entire area between nitride spacers 58 of adjacent sets of paired memory cells is filled with the deposited metal to form contact conductors 66 that are self aligned to the salicide regions 62 by the nitride spacers 58 (i.e. self aligned contact scheme, or SAC). The salicide layers 62 facilitate conduction between the conductors 66 and second regions 60. Bit lines 68 are added by metal masking over the BPSG 64, to connect together all the conductors 66 in each column of memory cells. The final memory cell structure is illustrated in FIG. 3M.

The self aligned contact scheme (SAC) removes an important constraint on the minimum spacing requirement between adjacent sets of paired memory cells. Specifically, while FIG. 3M illustrates the contact area (and thus conductors 66) perfectly centered over the salicide regions 62, in reality it is very difficult to form the contact openings without some undesirable horizontal shift relative to the salicide regions 62. With a non-self aligned contact scheme, where there is no protective insulation layer over the structure before BPSG formation, electrical shorts can occur if the contact 66 is shifted over and makes contact with poly block 54. To prevent electrical shorts in a non-self aligned contact scheme, the contact openings would have to be formed sufficiently away from the nitride spacers 58 so that even with the maximum possible shift in the contact regions, they will not extend to nitride spacers 58 or beyond. This of course would present a constraint on the minimum distance between spacers 58, in order to provide a sufficient tolerance distance between adjacent sets of paired mirror cells.

The SAC method of the present invention eliminates this constraint by forming the protective layer of material (nitride spacers 52 and 58) underneath the BPSG. With this protective layer, the contact openings are formed in the BPSG with a sufficient width to ensure there is overlap of the contact opening with the salicide regions 62, even if there is a horizontal shift of the contact opening during formation. Nitride spacers 52 and 58 allow portions of contacts 66 to be formed over poly blocks 54 without any shorting therebetween. The wide contact opening guarantees that contacts 66 completely fill the very narrow spaces between spacers 58, and makes good electrical contact with salicide regions 62. Thus, the width of contact regions between spacers 58 can be minimized to allow the scaling down of the overall cell dimension.

As shown in FIG. 3M, first and second regions 34/60 form the source and drain for each cell (those skilled in the art know that source and drain can be switched during operation). A channel region 70 for each cell is defined as the portion of the substrate that is in-between the source and drain 34/60. Poly blocks 54 constitute the control gates, and poly layer 14 constitutes the floating gate. The control gates 54 are generally rectangular in shape, but with a lower first portion 72 that is disposed adjacent the floating gate 14 (insulated therefrom by oxide layer 42), and an upper second portion 74 that protrudes over a portion of floating gate 14 and forms a notch 76. Floating gate 14 is over part of the channel region 70, is partially overlapped at one end by the control gate 54, and partially overlaps the first region 34 with its other end. As illustrated in the FIG. 3M, the process of the present invention forms pairs of memory cells that mirror each other. Each pair of mirrored memory cells is insulated from adjacent pairs of mirrored memory cells by nitride spacers 58.

Figure 3N:
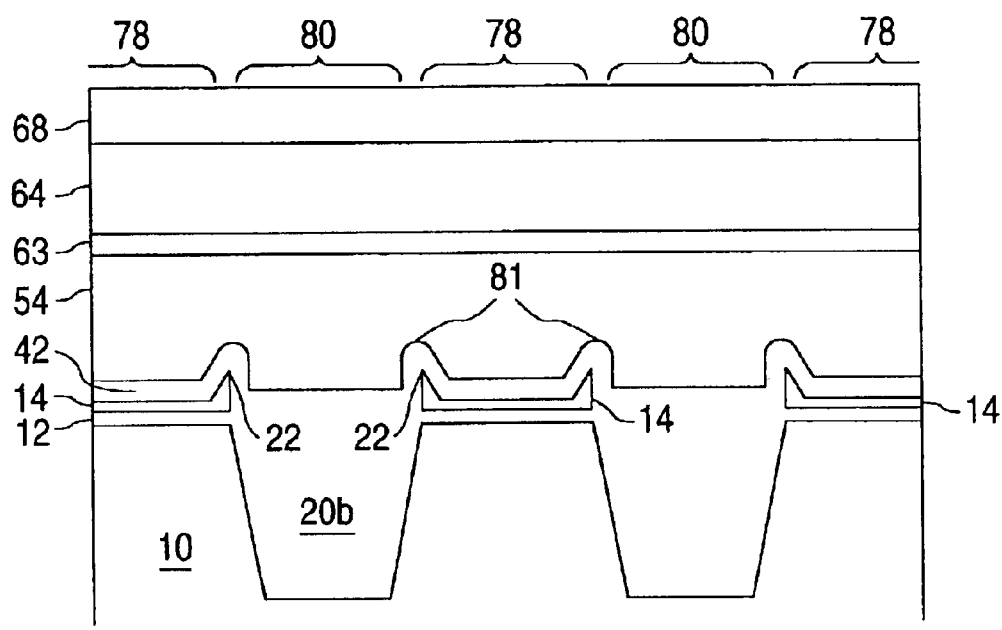
FIG. 3N is a cross sectional view taken along the line 3N of FIG. 3M showing an orthogonal view of the structure illustrated in FIG. 3M.

FIG. 3N shows an orthogonal view of the final structure shown in FIG. 3M. Active regions 78 are separated from each other by isolation regions 80. For each memory cell in the active regions 78, the floating gate 14 has a pair of sharp edges 22 that run parallel to the isolation regions 80 and extend upwardly toward and into grooves 81 formed in the bottom surface of the control gates 54. This orientation not only facilitates the formation of the sharp edges 22, but also enhances Fowler-Nordheim tunneling between the floating gate 14 and control gate 54 by providing two sharp edges 22 on each floating gate instead of one formed in an orthogonal orientation. Further, only a small portion of the sharp edges 22 are covered by the word line poly blocks 54, which enhances erase speeds. Lastly, there is a lower coupling ratio between 10% and 30% for better erase.

Figure 3O:
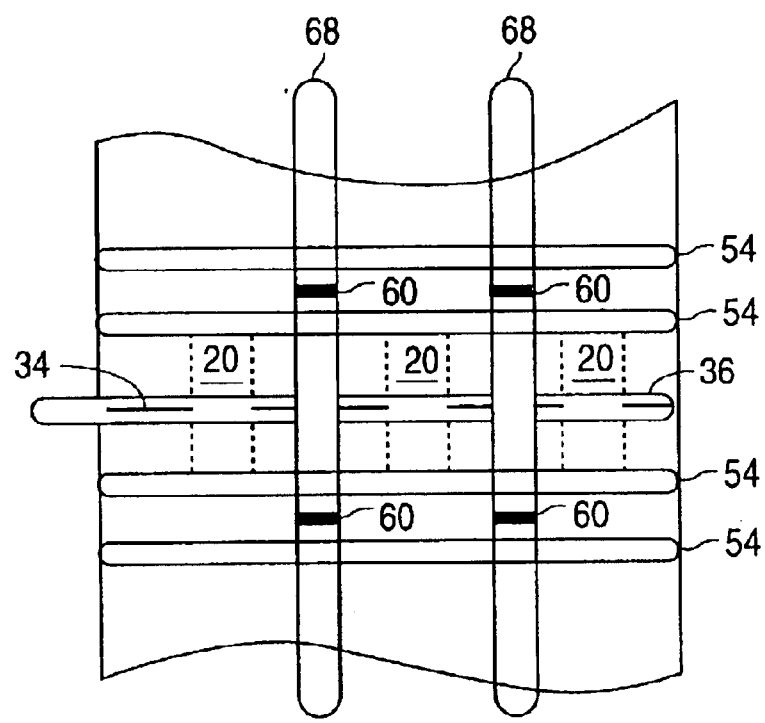
FIG. 3O is a top view showing the interconnection of row lines and bit lines to terminals in active regions in the formation of the non volatile memory array of floating memory cells of the split gate type.

Referring to FIG. 3O, there is shown a top plan view of the resulting structure and the interconnection of the bit lines 68 to the second regions 60 and of the control lines 54 which run in the X or the row direction and finally the source lines 36 which connect to the first regions 34 within the substrate 10. Although the source lines 36 (as should be understood by those skilled in the art, the word "source" is interchangeable with the word "drain") make contact with the substrate 10 in the entire row direction, i.e. contact with the active regions as well as the isolation regions, the source lines 36 electrically connect only to the first regions 34 in the substrate 10. In addition, each first region 34 to which the "source" line 36 is connected is shared between two adjacent memory cells. Similarly, each second region 60 to which the bit line 68 is connected is shared between adjacent memory cells from different mirror sets of memory cells.

The result is a plurality of non volatile memory cells of the split gate type having a floating gate 14, a control gate 54 which is immediately adjacent to but insulated from the floating gate 14 and connected to a substantially rectangularly shaped structure which runs along the length of the row direction connecting to the control gates of other memory cells in the same row, a source line 36 which also runs along the row direction, connecting the first regions 34 of pairs of memory cells in the same row direction, and a bit line 68 which runs along the column or Y direction, connecting the second regions 60 of pairs of memory cells in the same column. The formation of the control gate, the floating gate, the source line, and the bit line, are all self-aligned. The non-volatile memory cell is of the split gate type having floating gate to control gate tunneling as described in U.S. Pat. No. 5,572,054, whose disclosure is incorporated herein by reference with regard to the operation of such a non-volatile memory cell and an array formed thereby.

Figure 4A:
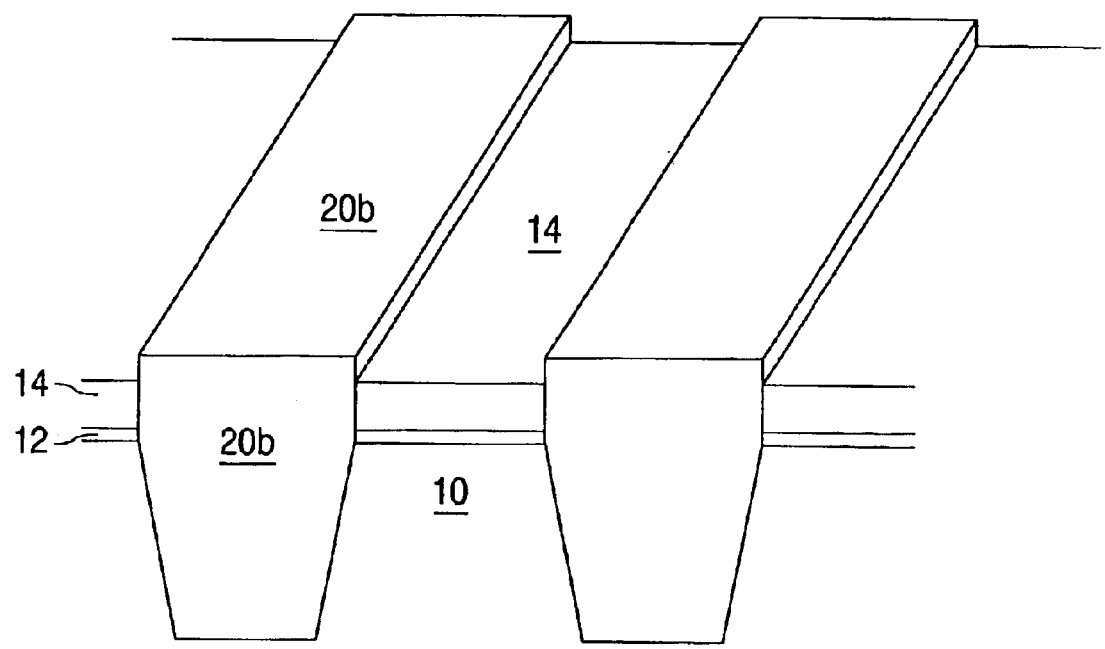
FIGS. 4A–4D are perspective views showing in sequence the steps in an alternate processing of the structure shown in FIG. 3A, in the formation of a non volatile memory array of floating memory cells of the split gate type.
Figure 4B:
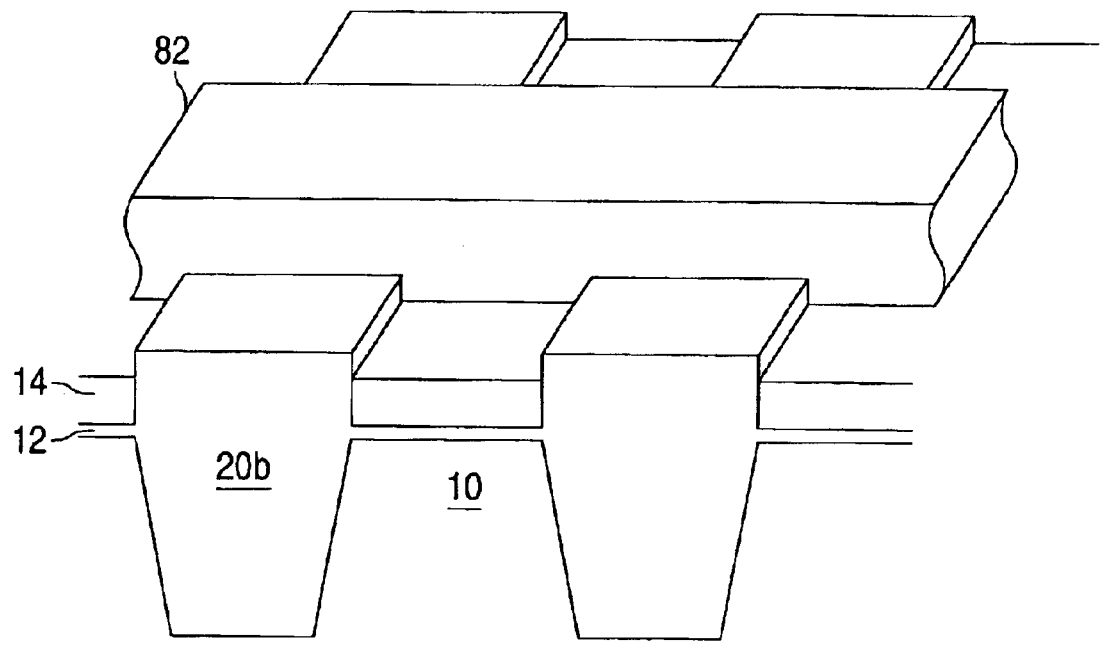
Figure 4C:
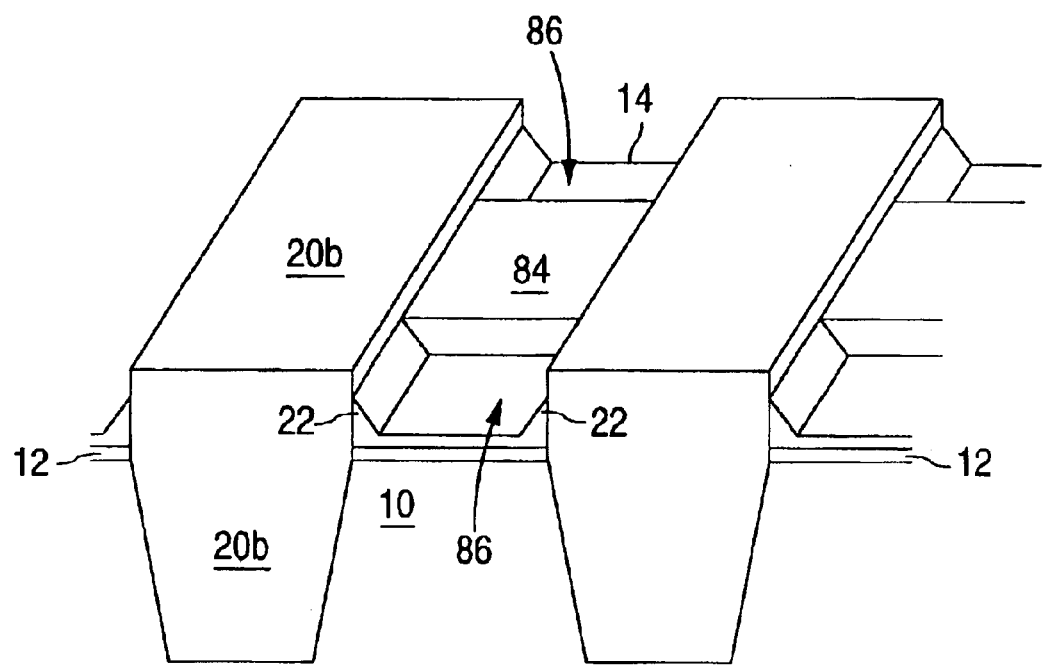

FIGS. 4A–4C illustrate an alternate process for forming a memory cell array similar to that illustrated in FIG. 3M, but with a different shape for the floating gates 14 in the finished device. This alternate process begins with the same structure as shown in FIG. 3A, a perspective view of which s shown in FIG. 4A. Before performing the poly etch process that forms sharp edges 22 (along the entire length of the floating gates as shown in FIG. 3B), a masking process is first performed. A suitable photo-resist is applied over the structure. A masking step is performed to selectively remove the photo-resist material from certain regions, leaving parallel stripes 82 of photo-resist that extend in the row direction and are centered over what will become the first regions in the substrate. The resulting structure is shown in FIG. 4B.

The anisotropic or sloped dry poly etch process is then performed to remove the exposed top portions of poly layer 14, where the raised sharp edges 22 are formed only on exposed portions of poly layer 14 along and against insulation material 20b. Specifically, first regions 84 of poly layer 14 (which are underneath photo-resist stripes 82) are unaffected by the etch process, while the second regions 86 of poly layer 14 are narrowed in thickness to form sharp side edges 22. For each column of layer 14, the sharp edges 22 run along the length of the sides of poly layer 14 that abut isolation regions 20b, and are interrupted by first regions 84 of poly layer 14 that extend orthogonally to the sharp edges 22. The remaining photo-resist is then removed, resulting in the structure shown in FIG. 4C.

Figure 4D:
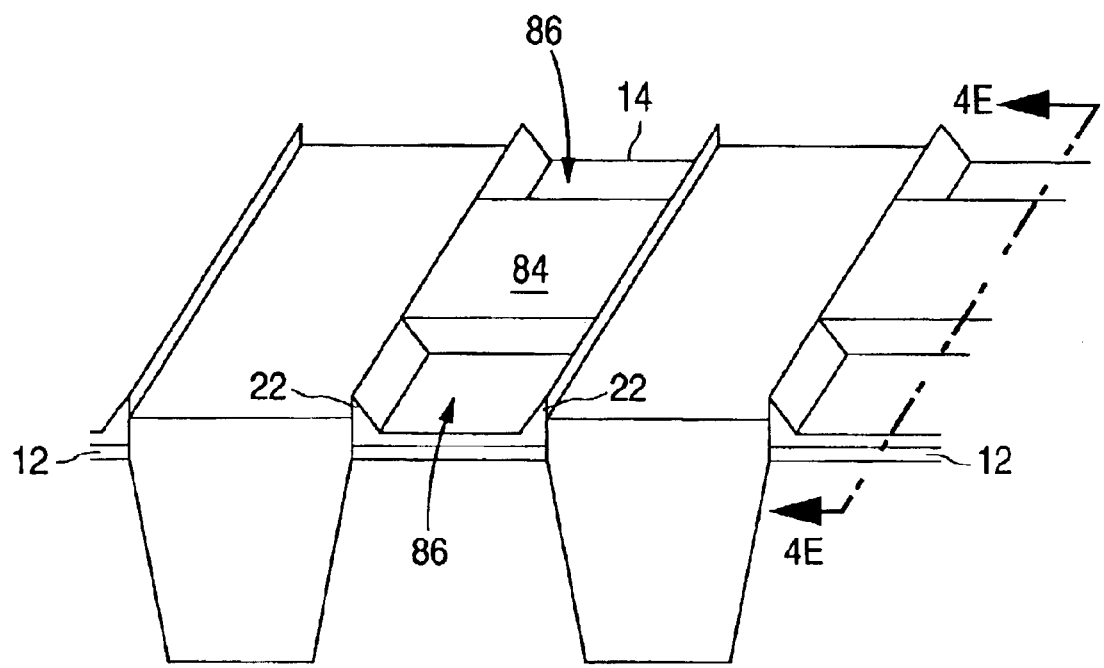
Figure 4E:
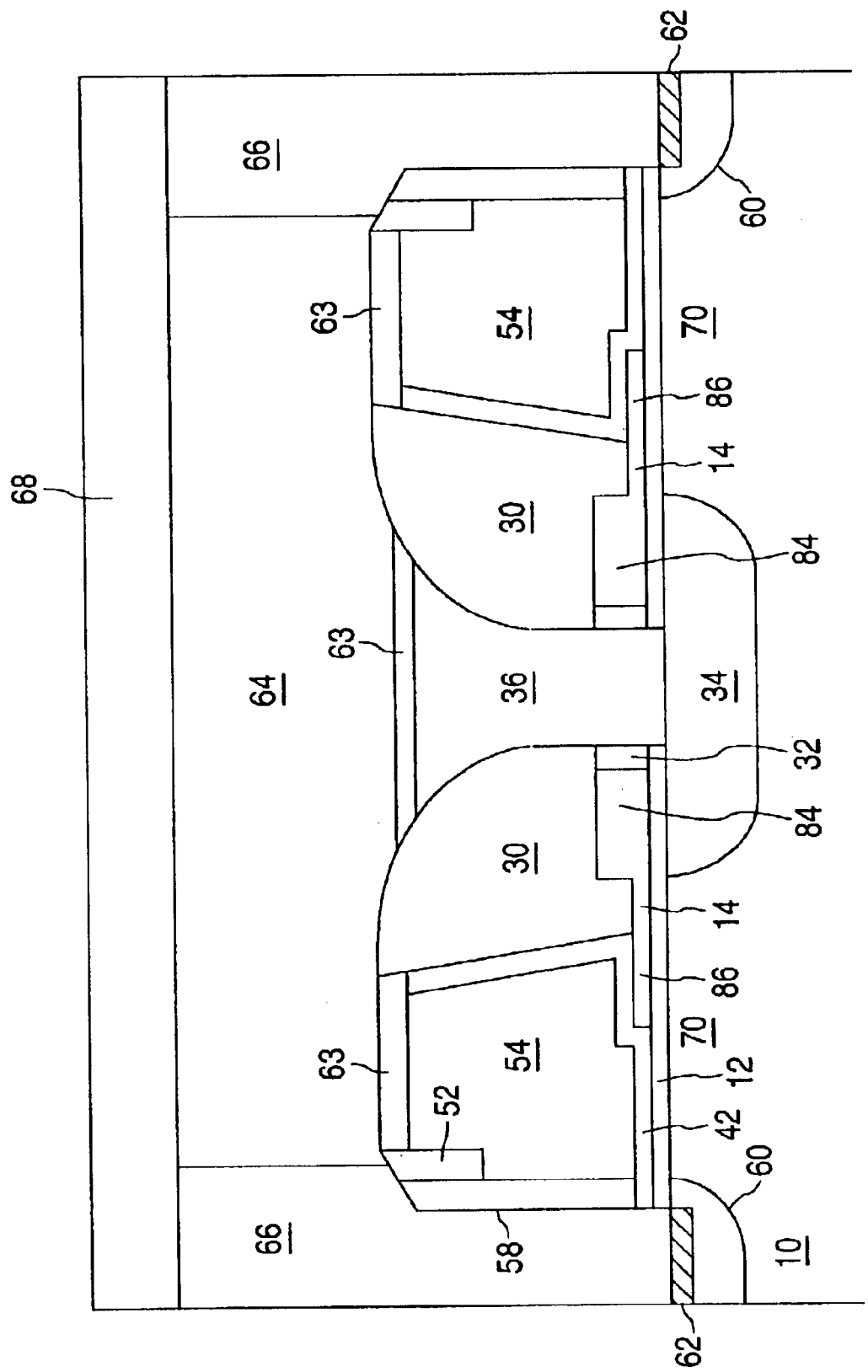
FIG. 4E is a cross sectional view taken along the line 4E of FIG. 4D showing the final structure formed by the alternate processing sequence.

An oxide etch back process is then performed to remove the top portions of oxide material 20b, such that the sharp edges 22 of poly layer 14 extend above the top surface of isolation oxide material 20b, as shown in FIG. 4D. The process is then continued as recited above with respect to the preferred embodiment, starting with the nitride deposition process as shown in FIG. 3D. The final structure of the mirror pair of memory cells formed by this alternate embodiment is shown in FIG. 4E, where each floating gate 14 has a first portion 84 that does not include sharp side edges, and a second portion 86 that includes the sharp side edges 22, is partially overlapped by control gate 54, and has a reduced average thickness compared to the first portions 84. The relative lengths of first and second portions 84/86 are dictated by the width of photo-resist stripe 82.

It is to be understood that the present invention is not limited to the embodiments described above and illustrated herein, but encompasses any and all variations falling within the scope of the appended claims. For example, although the foregoing method describes the use of appropriately doped polysilicon as the conductive material used to form the memory cells, it should be clear to those having ordinary skill in the art that any appropriate conductive material can be used. In addition, any appropriate insulator can be used in place of silicon dioxide or silicon nitride. Moreover, any appropriate material whose etch properties differ from silicon dioxide (or any insulator) and from polysilicon (or any conductor) can be used in place of silicon nitride. Further, as is apparent from the claims, not all method steps need be performed in the exact order illustrated or claimed, but rather in any order that allows for the proper formation of the memory cell of the present invention. Lastly, the formation of nitride spacers 52 can be omitted from the structure shown in FIG. 3K, with all nitride being removed at that step in the manufacturing method. Thus, the vertical wall 56 of control gate 54 would be defined by the edge of protective layer 50.

What is claimed is:

1. A self-aligned method of forming a semiconductor memory array of floating gate memory cells in a semiconductor substrate, each memory cell having a floating gate, a first region, a second region with a channel region therebetween, and a control gate, the method comprising the steps of:

a) forming a plurality of spaced apart isolation, regions on the substrate which are substantially parallel to one another and extend in a first direction, with an active region between each pair of adjacent isolation regions, each of the active regions comprising a first layer of insulation material on the semiconductor substrate and a first layer of conductive material on the first layer of insulation material;

b) etching a top portion of the first layer of conductive material to form a pair of raised opposing sharp edges in the first layer of conductive material in each of the active regions that have a length extending in the first direction;

c) etching portions of the first layer of conductive material to form a plurality of discrete floating gates in each of the active regions, wherein each floating gate includes a portion of the raised opposing pair of sharp edges;

e) forming a plurality of spaced apart blocks of electrically conductive material in each of the active regions, wherein each of the blocks partially overlaps with and is isolated from one of the floating gates;

e) forming a plurality of first regions in the substrate, wherein in each of the active regions, each of the floating gates partially overlaps with and is isolated from one of the first regions; and f) forming a plurality of second regions in the substrate, wherein in each of the active regions each of the second regions is spaced apart from the first regions.

2. The method of claim 1, wherein each of the control gates includes a bottom surface with a pair of grooves formed therein, and wherein each of the raised sharp edges are disposed adjacent to one of the isolation regions and extend toward one of the grooves.

3. The method of claim 2, wherein each of the conductive blocks extends in a second direction substantially perpendicular to the first direction and across adjacent isolation regions to electrically connect with conductive blocks in adjacent active regions.

4. The method of claim 2, wherein each of the conductive blocks extends across the active regions and isolation regions in a second direction substantially perpendicular to the first direction and partially overlaps one of the floating gates in each of the active regions.

5. The method of claim 2, wherein each of the conductive blocks overlaps with and is insulated from a portion of the raised opposing pair of sharp edges formed on one of the floating gates.

6. The method of claim 2, wherein each of the conductive blocks includes a lower portion that is disposed adjacent to and insulated from one of the floating gates.

7. The method of claim 6, wherein each of the conductive blocks includes an upper portion that extends over and is insulated from a portion of one of the floating gates.

8. The method of claim 7, wherein each of the conductive blocks forms a control gate having a notch formed underneath the upper portion.

9. The method of claim 2, further comprising the steps of:

forming a protective layer of material over a first portion of each of the blocks of conductive material, wherein a second portion of each of the blocks of conductive material is left uncovered by the layer of protective material; and etching the second portions of the blocks of conductive material to form a substantially vertical sidewall portion on each of the blocks of conductive material.

10. The method of claim 9, further comprising the steps of:

removing the protective layer of material from the blocks of conductive material, and forming a layer of metalized silicon on the blocks of conductive material.

11. The method of claim 9, wherein the formation of the protective layer includes the steps of:

forming a layer of insulation material over the second portions of the blocks of conductive material; and forming a spacer of insulation material over at least part of the first portions of the blocks of conductive material.

12. The method of claim 9, further comprising the steps of:

forming a side wall spacer of insulating material along each of the substantially vertical sidewall portions; and forming a layer of metalized silicon in each of the first regions immediately adjacent to one of the side wall spacers, wherein each of the layers of metalized silicon is self-aligned to the one of the first regions by one of the side wall spacers.

13. The method of claim 12, further comprising the step of:

forming a conductive material over each of the first regions and against the side wall spacer self aligning one of the layers of metalized silicon thereto.

14. The method of claim 9, further comprising the steps of:

forming a side wall spacer of insulating material along each of the substantially vertical sidewall portions such that pairs of the side wall spacers are adjacent to but spaced apart from each other with one of the first regions substantially therebetween;

forming a layer of metalized silicon in each one of the first regions between a pair of the side wall spacers corresponding to the one first region such that the layer of metalized silicon is self-aligned to the one first region by the corresponding pair of side wall spacers;

forming a layer of passivation material over the active regions;

forming contact openings through the passivation material, wherein for each of the contact openings:

the contact opening extends down to and exposes one of the metalized silicon layers, the contact opening has a lower portion bounded by the corresponding pair of side wall spacers, and the contact opening has an upper portion that is wider than a spacing between the corresponding pair of side wall spacers; and filling each of the contact openings with a conductive material.

15. The method of claim 2, wherein before the etching of the top portion of the first layer of conductive material, the method further comprises the step of:

forming a plurality of stripes of protective material over the active and isolation regions which are substantially parallel to one another and extend in a second direction that is perpendicular to the first direction, wherein the stripes of protective material protect portions of the first layer of conductive material from the etching of the first layer of conductive material so that the floating gates each have a first portion having the raised sharp edges and a second portion that does not have the raised sharp portions.

16. The method of claim 15, wherein each of the blocks of electrically conductive material partially overlaps with and is isolated from the first portion of one of the floating gates.

17. The method of claim 2, wherein the formation of the conductive blocks of material includes the following steps:

forming a plurality of spaced apart first trenches across the active regions and isolation regions which are substantially parallel to one another and extend in a second direction that is substantially perpendicular to the first direction;

forming first side wall spacers of a material on side Walls of the first trenches;

forming a second side wall spacer of a material on each of the first side wall spacers;

forming second trenches in each of the active regions adjacent to the first trenches, wherein the formation of the second trenches includes removing the first side wall spacers; and filling each of the second trenches with a second conductive material to form the blocks of conductive material.

18. The method of claim 17, further comprising the following steps:

forming a protective layer of material over a first portion of each of the blocks of conductive material, wherein a second portion of each of the blocks of conductive material is left uncovered by the layer of protective material; and etching the second portions of the blocks of conductive material to form a substantially vertical sidewall portion on each of the blocks of conductive material.

19. The method of claim 17, wherein for each of the blocks of conductive material:

the block is insulated from the substrate, and the block includes a protruding portion, formed by an indentation in the second trench side wall, that is disposed over and insulated from the first layer of conductive material.

20. The method of claim 17, wherein the formation of the first trenches comprises the steps of:

forming at least one layer of material over the first layer of conductive material;

selectively etching through the at least one layer of material to form top portions of the first trenches, wherein the first and second spacers are then formed in the first trenches; and etching between the second side wall spacers in each of the first trenches and through the first layer of conductive material to form bottom portions of the first trenches;

wherein the bottom portions of the first trenches have a smaller width than that of the top portions of the first trenches.

* * * * *